United States Patent
Yodogawa et al.

(10) Patent No.: US 7,030,437 B2
(45) Date of Patent: Apr. 18, 2006

(54) SEMICONDUCTOR DEVICE HAVING SENSE AMPLIFIER INCLUDING PAIRED TRANSISTORS

(75) Inventors: Satoshi Yodogawa, Hyogo (JP); Satoshi Kawasaki, Hyogo (JP); Takeshi Hamamoto, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 154 days.

(21) Appl. No.: 10/443,000

(22) Filed: May 22, 2003

(65) Prior Publication Data

US 2004/0150018 A1    Aug. 5, 2004

(30) Foreign Application Priority Data

Jan. 31, 2003    (JP)    ............... 2003-023636

(51) Int. Cl.
*H01L 27/108*    (2006.01)

(52) U.S. Cl. ............ 257/296; 257/295; 257/296; 257/298; 257/303; 257/306; 257/310

(58) Field of Classification Search ............ 257/369, 257/919, 295, 296, 298, 303, 306, 310; 365/230.03, 365/63
See application file for complete search history.

(56) References Cited

U.S. PATENT DOCUMENTS

| | | | |
|---|---|---|---|
| 5,175,604 A | * | 12/1992 | Nogami ............ 257/369 |
| 6,335,898 B1 | * | 1/2002 | Watanabe et al. ...... 365/230.03 |
| 6,566,698 B1 | * | 5/2003 | Nishihara et al. .......... 257/295 |

FOREIGN PATENT DOCUMENTS

| | | |
|---|---|---|
| JP | 56-134756 | 10/1981 |
| JP | 60-167360 | 8/1985 |
| JP | 61-206255 | 9/1986 |
| JP | 62-115861 | 5/1987 |
| JP | 63-291469 | 11/1988 |
| JP | 01-92991 | 4/1989 |
| JP | 05-198178 | 8/1993 |
| JP | 06-13574 | 1/1994 |

* cited by examiner

*Primary Examiner*—Mai-Huong Tran
(74) *Attorney, Agent, or Firm*—McDermott Will & Emery LLP

(57) ABSTRACT

A semiconductor device includes two sense amplifiers provided on a semiconductor substrate. Each of two sense amplifiers is formed of a pair of transistors. Two transistors are separated from each other by an element-isolating insulating portion provided on the semiconductor substrate. Therefore unlike the conventional, two transistors do not share the source region with each other, resulting in a semiconductor device with an improved sensitivity of a sense amplifier.

7 Claims, 7 Drawing Sheets

SEMICONDUCTOR DEVICE HAVING SENSE AMPLIFIER INCLUDING PAIRED TRANSISTORS

BACKGROUND OF THE INVENTION

1. Field of the Invention

The present invention relates to a semiconductor device including a sense amplifier.

2. Description of the Background Art

Conventionally, there is a demand for minimizing a chip area in a sense amplifier in an array portion of a semiconductor device, for example, a DRAM (Dynamic Random Access Memory) or the like. Therefore a conventional semiconductor device is formed in such a manner that a source region of a transistor forming one sense amplifier shares the same impurity diffusion region with a source region of a transistor forming another sense amplifier.

In the conventional semiconductor device described above, with an operating voltage of about 2.0 V, there is no serious problem in sensitivity of a sense amplifier. In order to operate the semiconductor device with a voltage lower than 2.0 V, however, a subtle degradation of the sensitivity of the sense amplifier is fatal.

In the conventional semiconductor device described above, there may be a difference in quality between a finished transistor forming one sense amplifier and a finished transistor forming another sense amplifier. In this case, a problem may arise when the source region of the transistor forming one sense amplifier shares the same impurity diffusion region with the source region of the transistor forming another sense amplifier.

In an NMOS (N-channel Metal Oxide Semiconductor), for example, when a large current flows only in the transistor forming one sense amplifier, the potential of the shared source region rises. Thus, the difference between the potential of the shared source region and the potential of the drain region of the transistor forming another sense amplifier becomes extremely small. In this case, the node of the transistor forming another sense amplifier is in a floating state, resulting in that the transistor forming another sense amplifier does not function normally.

On the other hand, in a PMOS (P-channel Metal Oxide Semiconductor), when a large current flows only in the transistor forming one sense amplifier, the potential of the shared source region lowers. Thus, the difference between the potential of the shared source region and the potential of the drain region of the transistor forming another sense amplifier becomes extremely small. Also in this case, the node of the transistor forming another sense amplifier is in a floating state, resulting in that the transistor forming another sense amplifier does not function normally.

In the case as described above, if the semiconductor device is operated with a voltage lower than 2.0 V, the sensitivity of the sense amplifier is reduced.

An object of the present invention is therefore to provide a semiconductor device with an improved sensitivity of a sense amplifier.

SUMMARY OF THE INVENTION

In a semiconductor device in accordance with one aspect of the present invention, two sense amplifiers simultaneously activated are arranged adjacent to each other and each of the two sense amplifiers receives a pair of data. Each of the two sense amplifiers includes a first transistor receiving one of the pair of data and a second transistor forming a pair with the first transistor for receiving the other of the pair of data.

A source/drain region of the first transistor is insulated from a source/drain region of the second transistor by an element-isolating insulating portion. A first contact is connected to the source/drain region of the first transistor. A second contact is connected to the source/drain region of the second transistor. The first contact and the second contact are connected to a same interconnection.

According to the configuration described above, since the source/drain region of the first transistor and the source/drain region of the second transistor are insulated from each other by the element-isolating insulating portion, the sensitivity of the sense amplifier can be improved as compared with a configuration where the source/drain region of the first transistor and the source/drain region of the second transistor share the same region.

Furthermore, since the first contact and the second contact are separately connected to the same interconnection, any inconvenience caused in one sense amplifier is less likely to have an adverse effect on another sense amplifier.

A semiconductor device in accordance with another aspect of the present invention includes plural pairs of transistors provided on a semiconductor substrate, each pair forming a sense amplifier. The plural pairs of transistors include one pair of transistors and another pair of transistors. One pair of transistors and another pair of transistors are separated from each other by an element-isolating insulating portion provided on the semiconductor substrate.

One pair of transistors includes a first transistor and a second transistor. The first transistor and the second transistor are separated from each other by the element-isolating insulating portion. The first transistor has a first gate electrode provided approximately parallel to a prescribed reference line. The second transistor has a second gate electrode provided approximately parallel to the prescribed reference line. An arrangement of a first source/drain region with respect to the first gate electrode in the first transistor is substantially identical to an arrangement of a second source/drain region with respect to the second gate electrode in the second transistor.

According to the configuration described above, the sensitivity of the sense amplifier can be improved as compared with a configuration where the source/drain region of one pair of transistors and the source/drain region of another pair of transistors share the same region.

Generally, in a manufacturing step of a semiconductor device, an error in registration (Alignment) causes a difference between a deviation in characteristic of the first transistor and a deviation in characteristic of the second transistor. According to the configuration as described above, however, the aforementioned difference is prevented because the arrangement of the first source/drain region with respect to the first gate electrode in the first transistor is substantially identical to the arrangement of the second source/drain region with respect to the second gate electrode. Therefore, the sensitivity of the sense amplifier is improved.

A semiconductor device in accordance with a further aspect of the present invention includes plural pairs of transistors provided on a semiconductor substrate, each pair forming a sense amplifier. The plural pairs of transistors include one pair of transistors and another pair of transistors. One pair of transistors includes a first transistor and a second transistor. The first transistor has a first source/drain region.

The second transistor has a second source/drain region. One pair of transistors includes a shared region that is shared between the first source/drain region and the second source/drain region.

According to the configuration described above, the sensitivity of the sense amplifier can be improved as compared with a configuration where the source/drain region of one pair of transistors and the source/drain region of another pair of transistors share the same region.

Furthermore, since the distance from the prescribed boundary line to the first transistor is approximately equal to the distance from the prescribed boundary line to the second transistor, a difference between the threshold voltage of the first transistor and the threshold voltage of the second transistor, which would be caused by different distances, can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, a semiconductor device of the embodiments of the present invention will be described with reference to the figures.

(First Embodiment)

First referring to FIGS. 1 and 2, a semiconductor device in a first embodiment will be described.

Figure 1:
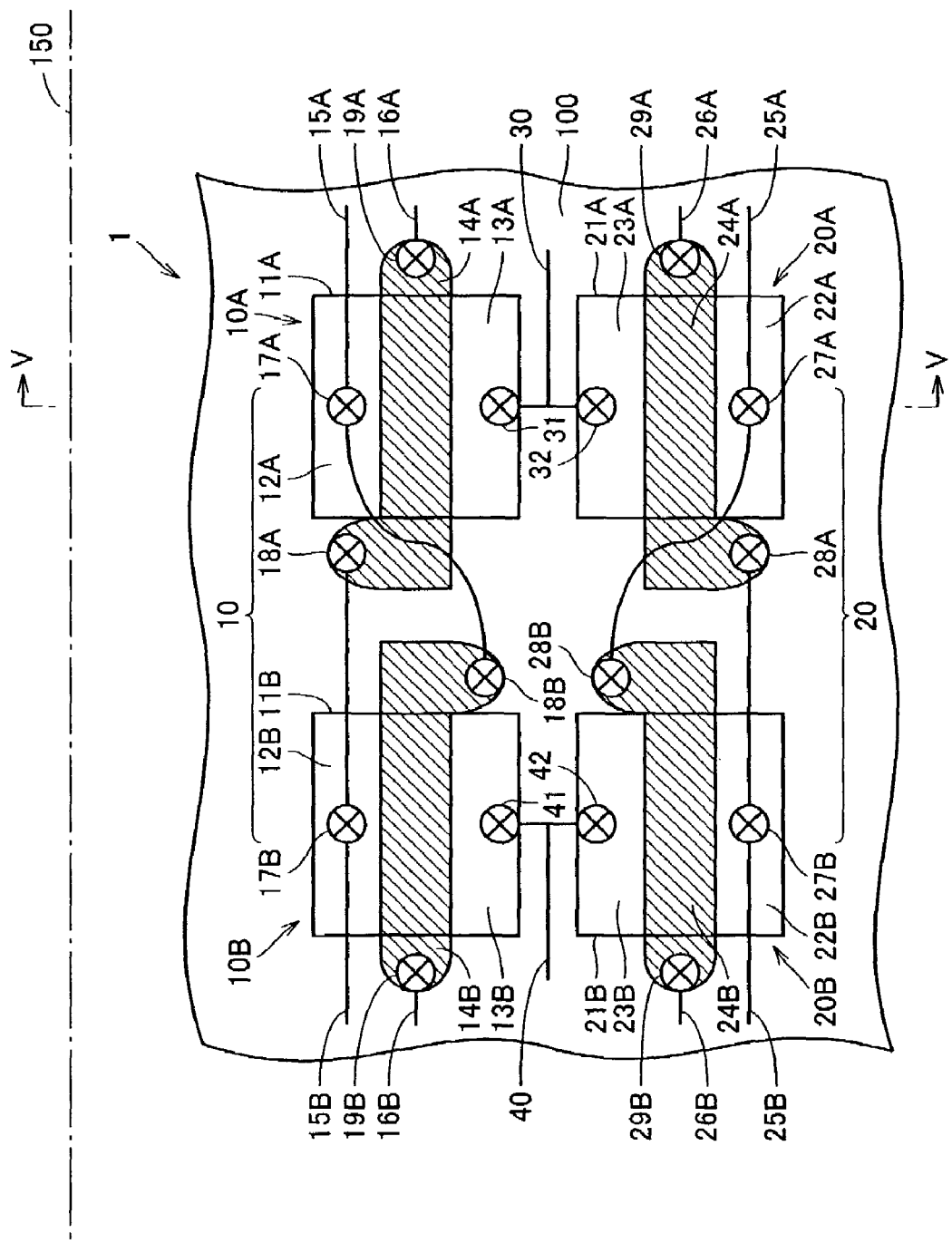
FIG. 1 is a planar schematic view illustrating a semiconductor device in accordance with a first embodiment of the present invention.

The semiconductor device in the present embodiment includes, as shown in FIG. 1, a semiconductor substrate and a sense amplifier 10 and a sense amplifier 20 provided on the semiconductor substrate. Sense amplifier 10 is formed with a pair of transistors 10A and 10B. Sense amplifier 20 is formed with a pair of transistors 20A and 20B.

Transistor 10A has a gate electrode 14A and a source/drain region 13A/12A provided on an element-forming region 11A. Transistor 10B has a gate electrode 14B and a source/drain region 13B/12B provided on an element-forming region 11B. Transistor 20A has a gate electrode 24A and a source/drain region 23A/22A provided on an element-forming region 21A. Transistor 20B has a gate electrode 24B and a source/drain region 23B/22B provided on an element-forming region 21B.

A bit line contact 17A extending perpendicularly to the semiconductor substrate is connected to drain region 12A. Bit line contacts 18A, 19A extending perpendicularly to the main surface of the semiconductor substrate are connected to gate electrode 14A. A bit line contact 31 extending perpendicularly to the main surface of the semiconductor substrate is connected to source region 13A.

A bit line contact 17B extending perpendicularly to the main surface of the semiconductor substrate is connected to drain region 12B. Bit line, contacts 18B, 19B extending perpendicularly to the main surface of the semiconductor substrate are connected to gate electrode 14B. A bit line contact 41 extending perpendicularly to the main surface of the semiconductor substrate is connected to source region 13B.

A bit line contact 27A extending perpendicularly to the main surface of the semiconductor substrate is connected to drain region 22A. Bit line contacts 28A, 29A extending perpendicularly to the main surface of the semiconductor substrate are connected to gate electrode 24A. A bit line contact 32 extending perpendicularly to the main surface of the semiconductor substrate is connected to source region 23A.

A bit line contact 27B extending perpendicularly to the main surface of the semiconductor substrate is connected to drain region 22B. Bit line contacts 28B, 29B extending perpendicularly to the main surface of the semiconductor substrate are connected to gate electrode 24B. A bit line contact 42 extending perpendicularly to the main surface of the semiconductor substrate is connected to source region 23B.

A bit line 15A extending parallel to the main surface of the semiconductor substrate is connected on bit line contacts 17A, 18B. A bit line 16A extending parallel to the main surface of the semiconductor substrate is connected on bit line contact 19A. A bit line 30 extending parallel to the main surface of the semiconductor substrate is connected on bit line contacts 31, 32.

A bit line 26A extending parallel to the main surface of the semiconductor substrate is connected on bit line contact 29A. A bit line 25A extending parallel to the main surface of the semiconductor substrate is connected on bit line contacts 27A, 28B.

A bit line 15B extending parallel to the main surface of the semiconductor substrate is connected on bit line contacts 17B, 18A. A bit line 16B extending parallel to the main surface of the semiconductor substrate is connected on bit line contact 19B.

A bit line 25B extending parallel to the main surface of the semiconductor substrate is connected on bit line contacts 27B, 28A. A bit line 26B extending parallel to the main surface of the semiconductor substrate is connected on bit line contact 29B. A bit line 40 extending parallel to the main surface of the semiconductor substrate is connected on bit line contacts 41, 42.

Transistors 10A, 10B and transistors 20A, 20B are separated from each other by an element-isolating insulating portion 100 provided on the semiconductor substrate.

According to the semiconductor device in the present embodiment having such a configuration, the sensitivity of sense amplifiers 10, 20 can be improved as compared with a configuration where source region 13A of transistor 10A and source region 23A of transistor 20A share the same region. Similarly, according to the semiconductor device in the present embodiment, the sensitivity of sense amplifiers 10, 20 can be improved when the semiconductor device in the present embodiment is compared with a semiconductor device in which source region 13B of transistor 10B and source region 23B of transistor 20B share the same region.

Furthermore, in the semiconductor device in the present embodiment, transistor 10A and transistor 10B are separated from each other by element-isolating insulating portion 100. Transistor 20A and transistor 20B are separated from each other by element-isolating insulating portion 100. This element-isolating insulating portion may be a trench isolation insulating film formed in a trench of a semiconductor substrate or it may be an oxide film formed by LOCOS (Local Oxidation of Silicon) process.

According to this structure, the degree of freedom in the design of the positional relation between transistor 10A and transistor 10B can be increased as compared with the structure in which transistor 10A is not separated from transistor 10B. Similarly, according to the structure described above, the degree of freedom in the design of the positional relation between transistor 20A and transistor 20B can be increased as compared with the structure in which transistor 20A is not separated from transistor 20B.

Transistors 10A, 20A have gate electrodes 14A, 24A, respectively, provided approximately parallel to a prescribed reference line 150. Transistors 10B, 20B have gate electrode 14B, 24B, respectively, provided approximately parallel to the prescribed reference line 150.

The arrangement of source/drain region 13A/12A with respect to gate electrode 14A in transistor 10A is substantially identical to the arrangement of source/drain region 13B/12B with respect to gate electrode 14B in transistor 10B. Furthermore, the arrangement of source/drain region 23A/22A with respect to gate electrode 24A in transistor 20A is substantially identical to the arrangement of source/drain region 23B/22B with respect to gate electrode 24B in transistor 20B.

The structure as described above is advantageous in a manufacturing method in which gate electrodes 14A, 14B, 24A, and 24B are simultaneously formed using the same reticle in an exposure step.

In the manufacturing method as described above, gate electrodes 14A, 24A and gate electrodes 14B, 24B are formed to overlap in space with source/drain regions 13A/12A, 23A/22A and source/drain regions 13B/12B, 23B/22B, respectively.

Figure 2:
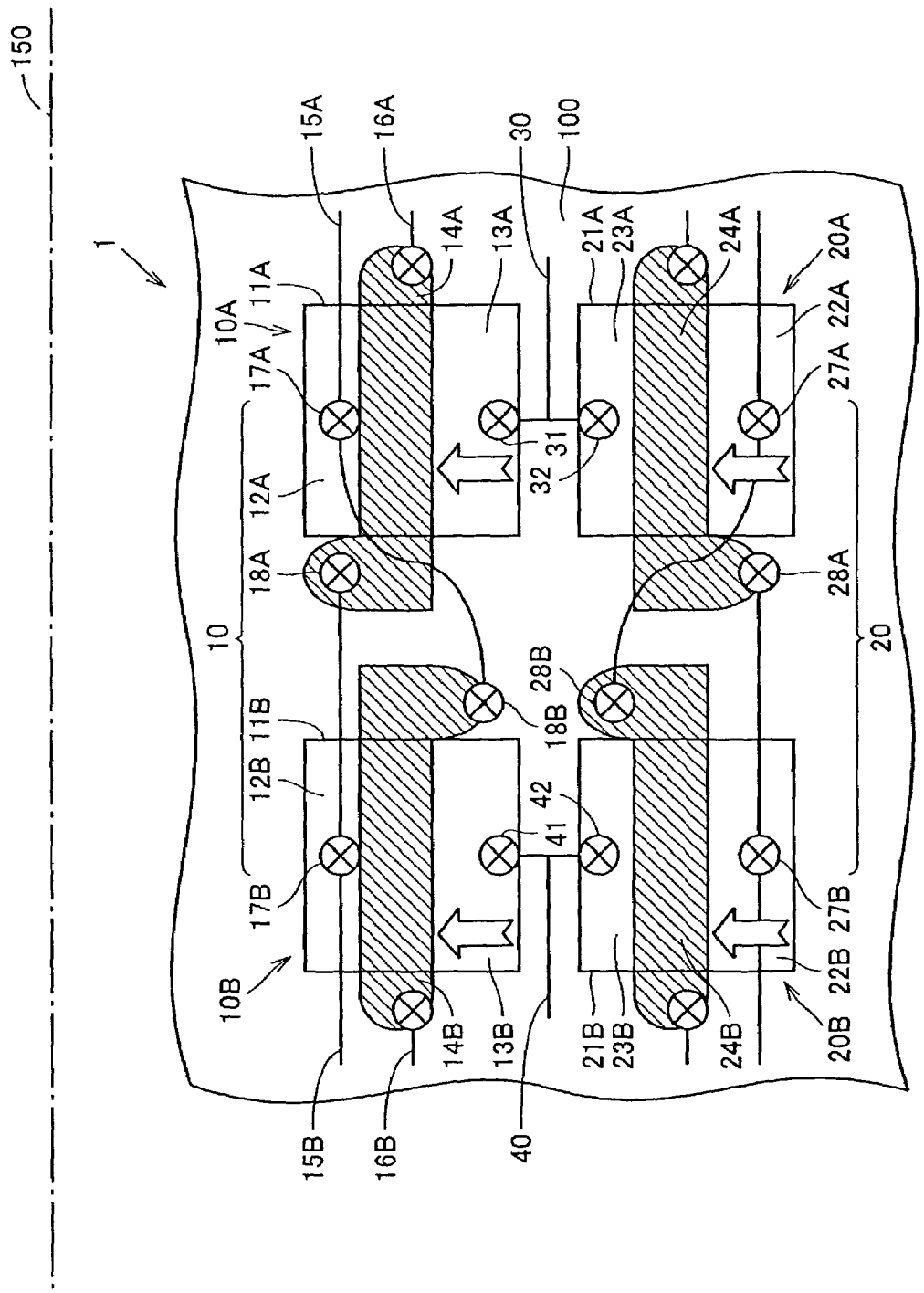
FIG. 2 is a view showing a shifted overlap between a source/drain region and a gate electrode in a manufacturing process of the semiconductor device in the first embodiment.

At this point, as shown in a hollow arrow in FIG. 2, the overlapping regions may be shifted from each other in a direction perpendicular to the prescribed reference line 150 as described above. In such a case, an error may be caused in the overlap between the gate electrode and the source/drain region.

The semiconductor device in the present embodiment, however, is configured in such a manner that the arrangement of source/drain region 13A/12A with respect to gate electrode 14A in transistor 10A is substantially identical to the arrangement of source/drain region 13B/12B with respect to gate electrode 14B in transistor 10B. Furthermore, it is configured in such a manner that the arrangement of source/drain region 23A/22A of gate electrode 24A in transistor 20A is substantially identical to the arrangement of source/drain region 23B/22B with respect to gate electrode 24B in transistor 10B.

Therefore the arrangement of transistor 10A with the shifted overlap between gate electrode 14A and source/drain region 13A/12A becomes substantially identical to the arrangement with the shifted overlap between gate electrode 14B and source/drain region 13B/12B. Furthermore the arrangement of transistor 20A with the shifted overlap between gate electrode 24A and source/drain region 23A/22A becomes substantially identical to the arrangement with the shifted overlap between gate electrode 24B and source/drain region 23B/22B.

As a result, the deviation in characteristic of transistor 10A and the deviation in characteristic of transistor 10B, due to the error in the overlap, will be the same. Furthermore, the deviation in characteristic of transistor 20A and the deviation in characteristic of transistor 20B, due to the error in the overlap, will be the same. Therefore the characteristics of sense amplifiers 10, 20 are improved.

Figure 3:
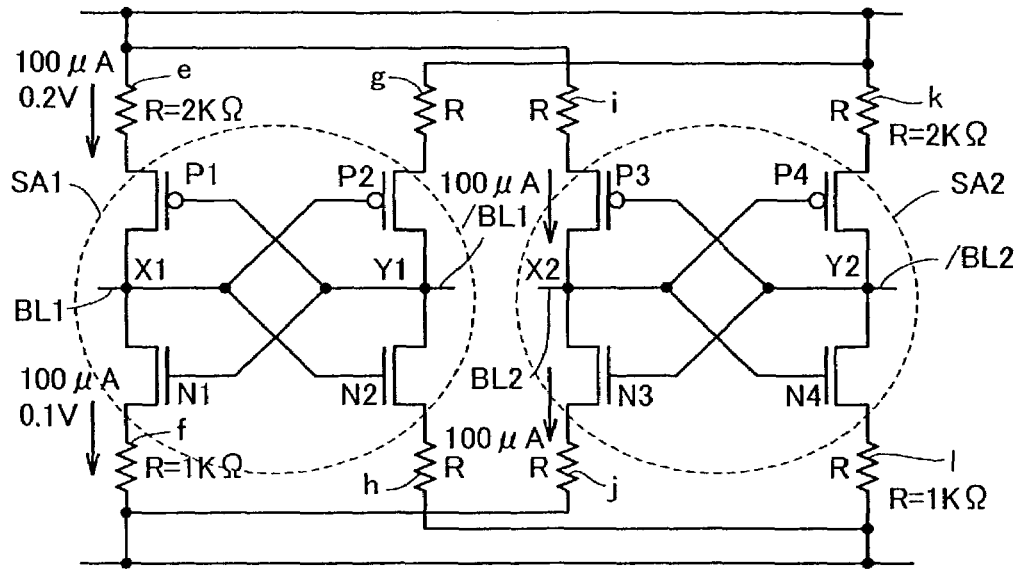
FIG. 3 is a circuit diagram of the semiconductor device in FIG. 1.

FIG. 3 is a circuit diagram corresponding to sense amplifiers 10, 20 shown in FIG. 1 or FIG. 2. The reference characters shown in FIG. 3 indicate the circuit parts corresponding to the parts denoted with the reference characters in FIG. 1 or 2.

As shown in FIG. 3, when transistors 10A, 10B and transistors 20A, 20B are separated from each other by element-isolating insulating portion 100 as in the structure shown in FIG. 1 or 2, separate resistance elements a-1 corresponding to the bit line contacts are independently formed. The circuit shown in FIG. 4 is a comparative example of the circuit shown in FIG. 3.

Figure 4:
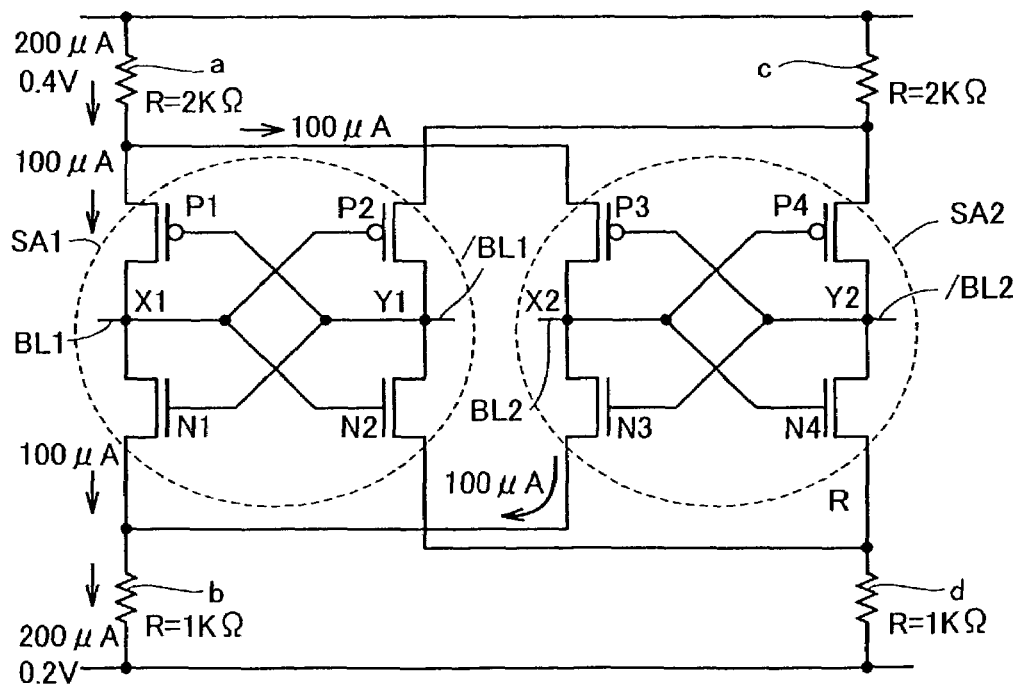
FIG. 4 is a circuit diagram of a comparative example of the circuit diagram in FIG. 3.

In FIGS. 3 and 4, sense amplifier SA1 and SA2 are provided adjacent to each other. A bit line BL1 is connected to a node X1. A /bit line/BL1 is connected to a node Y1. A bit line BL2 is connected to a node X2. A /bit line/BL2 is connected to a node Y2. Bit line BL1 and /bit line/BL1 form a pair. Bit line BL2 and /bit line/BL2 form a pair. A resistance value of each of resistance elements a, c, e, g, i, k is 2 kΩ and a resistance value of each of resistance elements b, d, f, h, j, l is 1 kΩ.

In sense amplifier SA1, NMOS (N-channel Metal Oxide Semiconductor) transistors N1, N2 and PMOS (P-channel Metal Oxide Semiconductor) transistors P1, P2 are formed to have a circuit characteristic of functioning symmetrically for input data on bit line BL1 and /bit line/BL1. In sense amplifier SA2, NMOS transistors N3, N4 and PMOS transistors P3, P4 are formed to have a circuit characteristic of functioning symmetrically for input data on bit line BL2 and /bit line/BL2. It is noted that each of both NMOS transistors N1, N2 and PMOS transistors P1, P2 is sized to have a width W=3 μm and a length L=0.3 μm.

When the semiconductor device is driven and data is read from the memory having sense amplifiers SA1, SA2, both of sense amplifiers SA1 and SA2 are activated.

In the circuit shown in FIG. 4, each of resistance elements a, b, c, d of sense amplifier SA2 also functions as the resistance element of sense amplifier SA1.

Therefore, in the circuit shown in FIG. 4, under the condition that a current of 100 μA flows in each of sense amplifiers SA1 and SA2, a current of 200 μA flows in each of resistance elements a and b. At this point, a voltage drop of 0.4 V occurs at resistance element a and a voltage drop of 0.2 V occurs at resistance element b.

Here, when current flows in each of resistance elements a, b, current does not flow in each of resistance elements c, d. Therefore no voltage drop occurs at each of resistance elements c, d. As a result, there exists an unbalanced difference of voltage drop of 0.6V between sense amplifier SA1 and sense amplifier SA2.

In the circuit shown in FIG. 3, however, under the condition that a current of 100 μA flows in each of sense amplifier SA1 and sense amplifier SA2, only 100 μA at maximum flows in each of resistance elements e-1 corresponding to the bit line contacts. Therefore only a difference of voltage effect of 0.3 V at maximum occurs between sense amplifier SA1 and sense amplifier SA2.

In other words, in the circuit shown in FIG. 3, resistance elements i, j, k, l respectively corresponding to the bit line contacts of sense amplifier SA2 are formed separately from and independently of resistance elements e, f, g, h corresponding to the bit line contacts of the adjacent sense amplifier SA1, so that the current flowing in each of resistance elements i, j, k, l can be made smaller than that in the circuit in FIG. 4.

In the circuit as shown in FIG. 4, due to variations in dimensional precision of the sense amplifier in the manufacturing step, sense amplifier SA1 may not have symmetry for data input onto bit line BL1 and /bit line /BL1. In this case, the effect of the unbalance in voltage drop of the resistance elements as described above is added to the effect of asymmetry of sense amplifier SA1, so that the degree of asymmetry of the sense amplifier characteristic may further be increased.

According to the circuit shown in FIG. 3 as described above, however, the degree of asymmetry of the sense amplifier does not become so large as the circuit shown in FIG. 4. Therefore the characteristic of the semiconductor device is improved.

Figure 5:
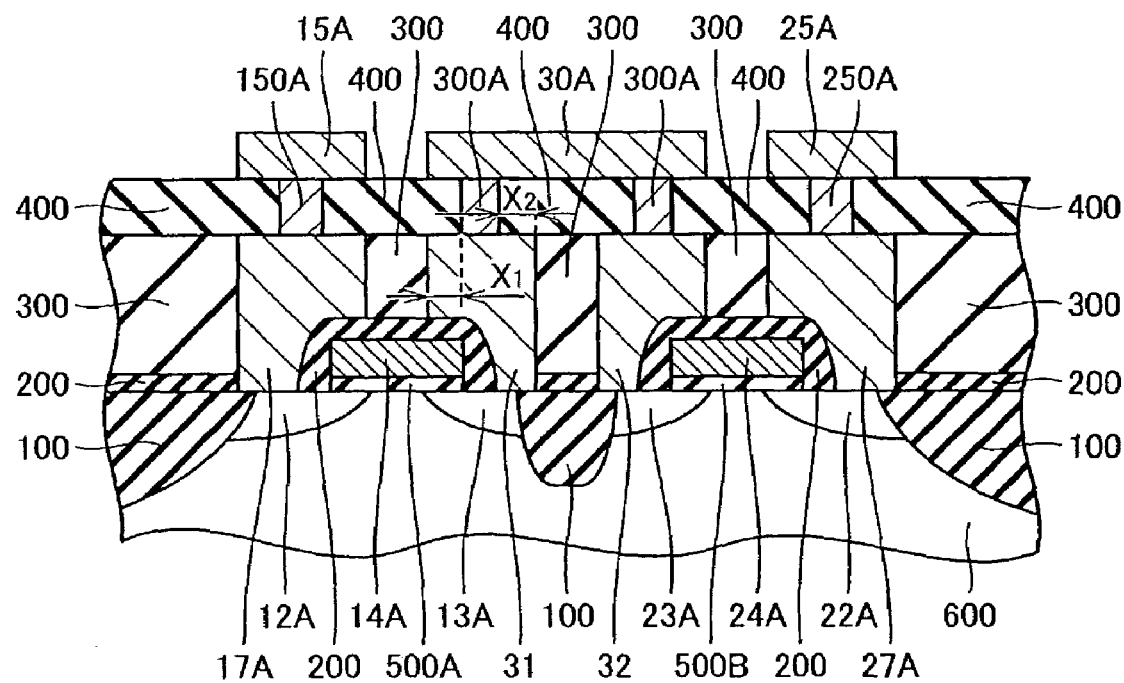
FIG. 5 is a cross sectional view taken along V—V in FIG. 1.

A cross section taken along X—X in FIG. 1 will now be described with reference to FIG. 5. As shown in FIG. 5, element-isolating insulating portion 100 is formed at a prescribed depth from a main surface of a semiconductor substrate 600. On the inside of element-isolating insulating portion 100, source/drain regions 12A, 13A, 23A, 22A are formed.

A gate insulating film 500A is formed on source/drain regions 12A, 13A. Gate electrode 14A is formed on gate insulating film 500A. A silicon nitride film 200 is formed to cover gate insulating film 500A and gate electrode 14A. A gate insulating film 500B is formed on source/drain regions 23A, 22A.

Gate electrode 24A is formed on gate insulating film 500B. Silicon nitride film 200 is formed to cover gate insulating film 500B and gate electrode 24A. Silicon nitride film 200 is also formed on element-isolating insulating portion 100. Bit line contact 17A is connected to source/drain region 12A. Bit line contact 31 is connected to source/drain region 13A.

Bit line contact 32 is connected to source/drain region 23A. Bit line contact 27A is connected to source/drain region 22A. Bit line contacts 17A, 31, 32, 27A are buried in an interlayer insulating film 300. An interlayer insulating film 400 is formed on interlayer insulating film 300 and each bit line contact.

Bit line contact 17A is connected to a contact plug 150A. Bit line contact 31 is connected to a contact plug 300A. Bit line contact 32 is connected to a contact plug 300A. Bit line contact 27A is connected to contact plug 250A.

An interconnection layer is formed on interlayer insulating film 400. An interconnection layer 15A is connected to contact plug 150A. This interconnection layer is a bit line. Bit line 15A is connected to contact plug 150A. Bit line 25A is connected to contact plug 250A. Bit line 30A is connected to contact plug 300A.

In the conventional semiconductor device, since source/drain region 13A and source/drain region 23A share the same region, element-isolating insulating portion 100 therebetween is not required. Therefore, in the semiconductor device having the structure shown in FIG. 1 or 2, the two-dimensional size of the element is increased by an amount of element-isolating insulating portion 100.

Figure 6:
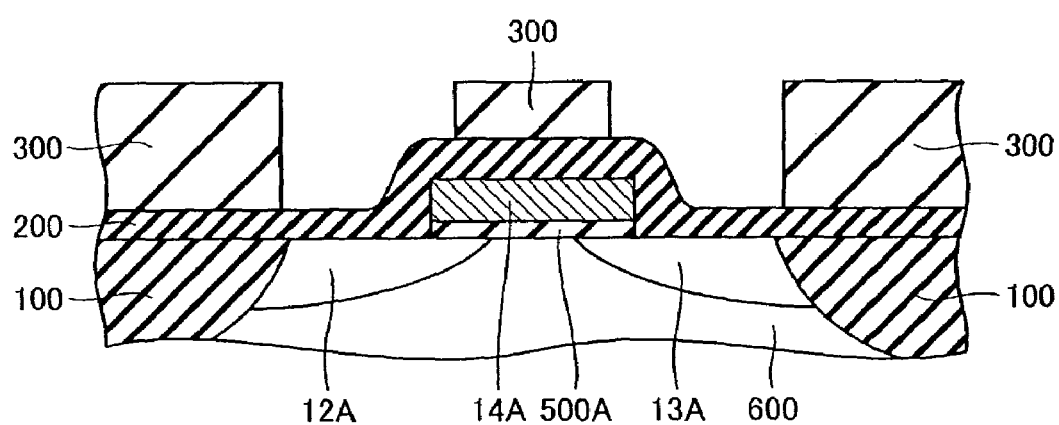
FIGS. 6 and 7 are views illustrating a method of manufacturing the structure in FIG. 5.
Figure 7:
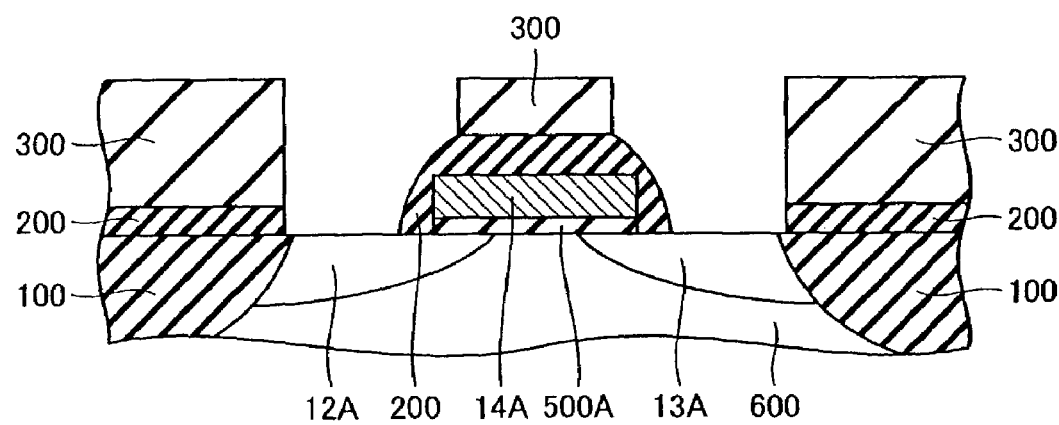

In the semiconductor device in the present embodiment, however, the distance indicated by X1 and X2 shown in FIG. 5 can be minimized by forming silicon nitride film 200 on element-isolating insulating portion 100 and gate electrodes 14A, 24A through the manufacturing steps in FIGS. 6 and 7 as illustrated below. Therefore element-isolating insulating portion 100 can be formed between source/drain region 13A and source/drain region 23A without increasing the two-dimensional size of the semiconductor device.

The method of manufacturing the structure of the semiconductor device as shown in FIG. 5 will now be described. First, as shown in FIG. 6, element-isolating insulating portion 100 is formed in semiconductor substrate 600. Next, source/drain regions 12A, 13A are formed on the inside of element-isolating insulating portion 100. Gate insulating film 500A and gate electrode 14A are formed on semiconductor substrate 600. Silicon nitride film 200 is then formed to cover the main surface of semiconductor substrate 600, the surface of element-isolating insulating portion 100 made of a silicon oxide film, gate insulating film 500A, and gate electrode 14A.

Interlayer insulating film 300 is then formed to have a prescribed pattern. More specifically, interlayer insulating film 300 is formed having a pattern having an opening for a bit line contact which will be formed later. Using interlayer insulating film 300 as a mask, silicon nitride film 200 is etched. Source/drain regions 12A, 13A are thereby exposed. To connect to these source/drain regions 12A, 13A, metal serving as bit line contacts 17A, 27A are buried. This complete the connection between source/drain regions 12A, 13A and bit line contacts 17A, 27A.

As compared with the conventional sense amplifier having a shared source, the sense amplifier in the present embodiment has the two-dimensional size increased by a width of element-isolating insulating portion 100. In accordance with the manufacturing method described above, however, the step of forming bit line contacts 17A, 27A is performed with element-isolating insulating portion 100 formed of a silicon oxide film covered with silicon nitride film 200. Therefore in the step of forming the bit line contact, element-isolating insulating portion 100 is hardly etched. Thus, even if distance X1 and distance X2 in FIG. 5 are reduced, such an inconvenience is prevented that the bit line contact penetrates element-isolating insulating portion 100 to reach the impurity diffusion region below source/drain regions 12A, 13A. As a result, the size of the semiconductor device can be reduced in a direction parallel to the main surface of semiconductor substrate 600.

(Second Embodiment)

A semiconductor device in accordance with a second embodiment will now be described with reference to FIGS. 8 and 9.

Figure 8:
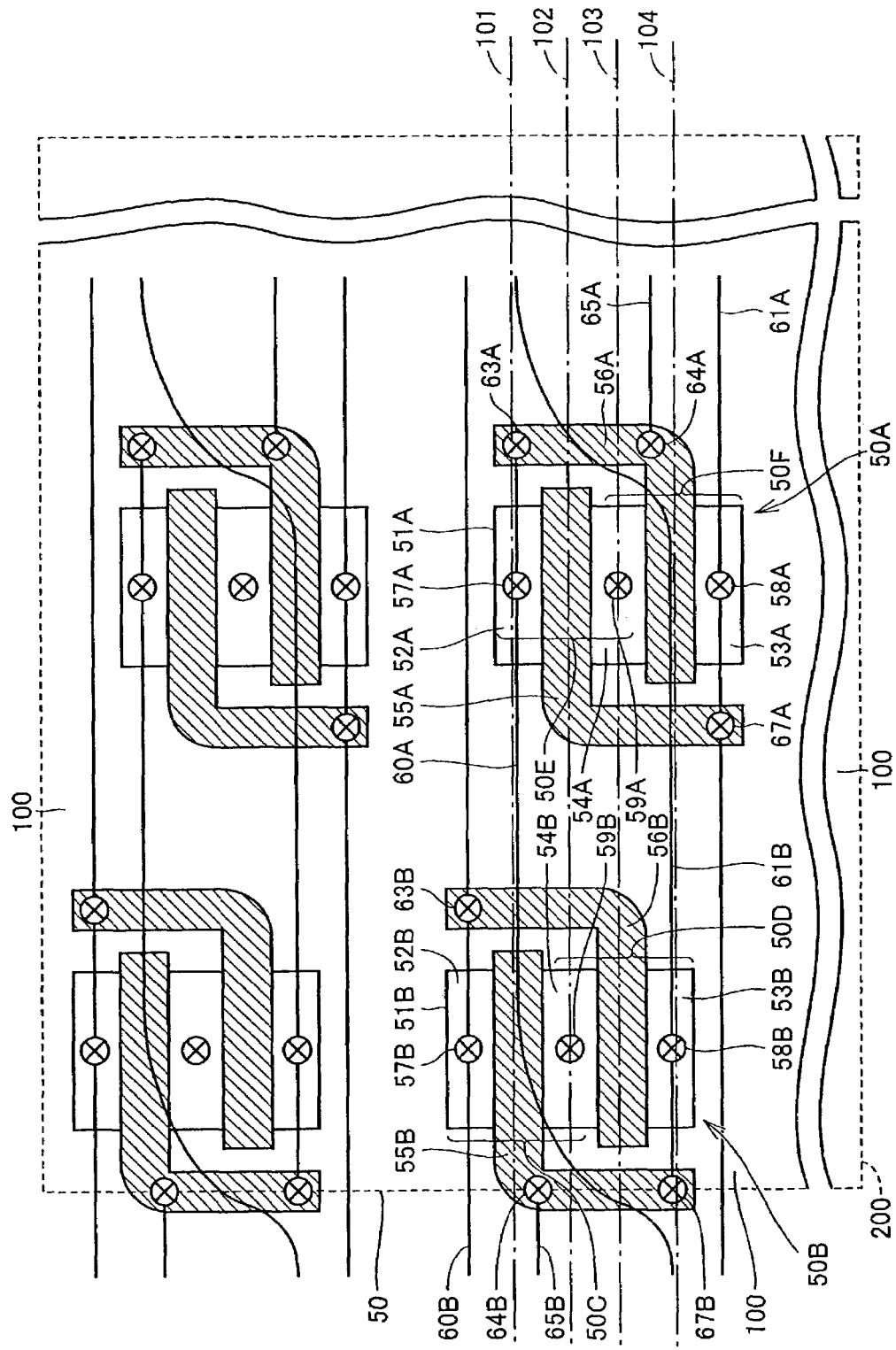
FIG. 8 is a planar schematic view illustrating a semiconductor device in accordance with a second embodiment of the present invention.

The semiconductor device in the present embodiment includes, as shown in FIG. 8, a semiconductor substrate, and a sense amplifier 50A and a sense amplifier 50B provided on the semiconductor substrate. Sense amplifier 50A is formed with a pair of transistors 50E and 50F. Sense amplifier 50B is formed with a pair of transistors 50C and 50D.

Transistor 50F has a gate electrode 56A and a source/drain region 54A/53A provided in an element-forming region 51A. Transistor 50E has a gate electrode 55A and a source/drain region 54A/52A provided in an element-forming region 51A. Transistor 50D has a gate electrode 56B and a source/drain region 54A/53B provided in an element-forming region 51B. Transistor 50C has a gate electrode 55B and a source/drain region 54B/52B provided in an element-forming region 51B.

A bit line contact 57A extending perpendicularly to the semiconductor substrate is connected to drain region 52A. A bit line contact 67A extending perpendicularly to the main surface of the semiconductor substrate is connected to gate electrode 55A. A bit line contact 58A extending perpendicularly to the main surface of the semiconductor substrate is connected to drain region 53A. Bit line contacts 63A, 64A extending perpendicularly to the main surface of the semiconductor substrate are connected to gate electrode 56A. A bit line contact 59A extending perpendicularly to the main surface of the semiconductor substrate is connected to source region 54A.

A bit line contact 57B extending perpendicularly to the main surface of the semiconductor substrate is connected to drain region 52B. Bit line contacts 64B, 67B extending perpendicularly to the main surface of the semiconductor substrate are connected to gate electrode 55B. A bit line contact 58B extending perpendicularly to the main surface of the semiconductor substrate is connected to drain region 53B. A bit line contact 63B extending perpendicularly to the main surface of the semiconductor substrate is connected to gate electrode 56B. A bit line contact 59B extending perpendicularly to the main surface of the semiconductor substrate is connected to source region 54B.

A bit line 60A extending parallel to the main surface of the semiconductor substrate is connected on bit line contacts 57A, 63A. A bit line 65A extending parallel to the main surface of the semiconductor substrate is connected on bit line contact 64A. A bit line 61A extending parallel to the main surface of the semiconductor substrate is connected on bit line contacts 58A, 67A.

A bit line 60B extending parallel to the main surface of the semiconductor substrate is connected on bit line contacts 57B, 63B. A bit line 65B extending parallel to the main surface of the semiconductor substrate is connected on bit line contact 64B. A bit line 61B extending parallel to the main surface of the semiconductor substrate is connected on bit line contacts 58B, 67B.

It is noted that in the semiconductor device in the present embodiment another sense amplifier pair having the similar structure as sense amplifiers 50A, 50B is provided in the vicinity of sense amplifiers 50A, 50B. A bit line pair for another sense amplifier pair extends in a direction parallel to the direction in which the bit lines for sense amplifiers 50A, 50B extend.

A pair of transistors 50E and 50F and a pair of transistors 50C and 50D are separated from each other by element-isolating insulating portion 100 provided on the semiconductor substrate.

According to such a structure, the sensitivity of sense amplifiers 50A, 50B can be improved as compared with the structure in which source region 54A of a pair of transistors 50E, 50F and source region 54B of a pair of transistors 50C, 50D share the same region.

The semiconductor device in the present embodiment will be described in detail with reference to FIG. 9. Transistor 50C has a source/drain region 54B/52B. Transistor 50D has a source/drain region 54B/53B.

According to the structure described above, a pair of transistors 50C and 50D shares source/drain region 54B. Therefore, an area occupied by a pair of transistors 50C and 50D can be reduced.

Figure 9:
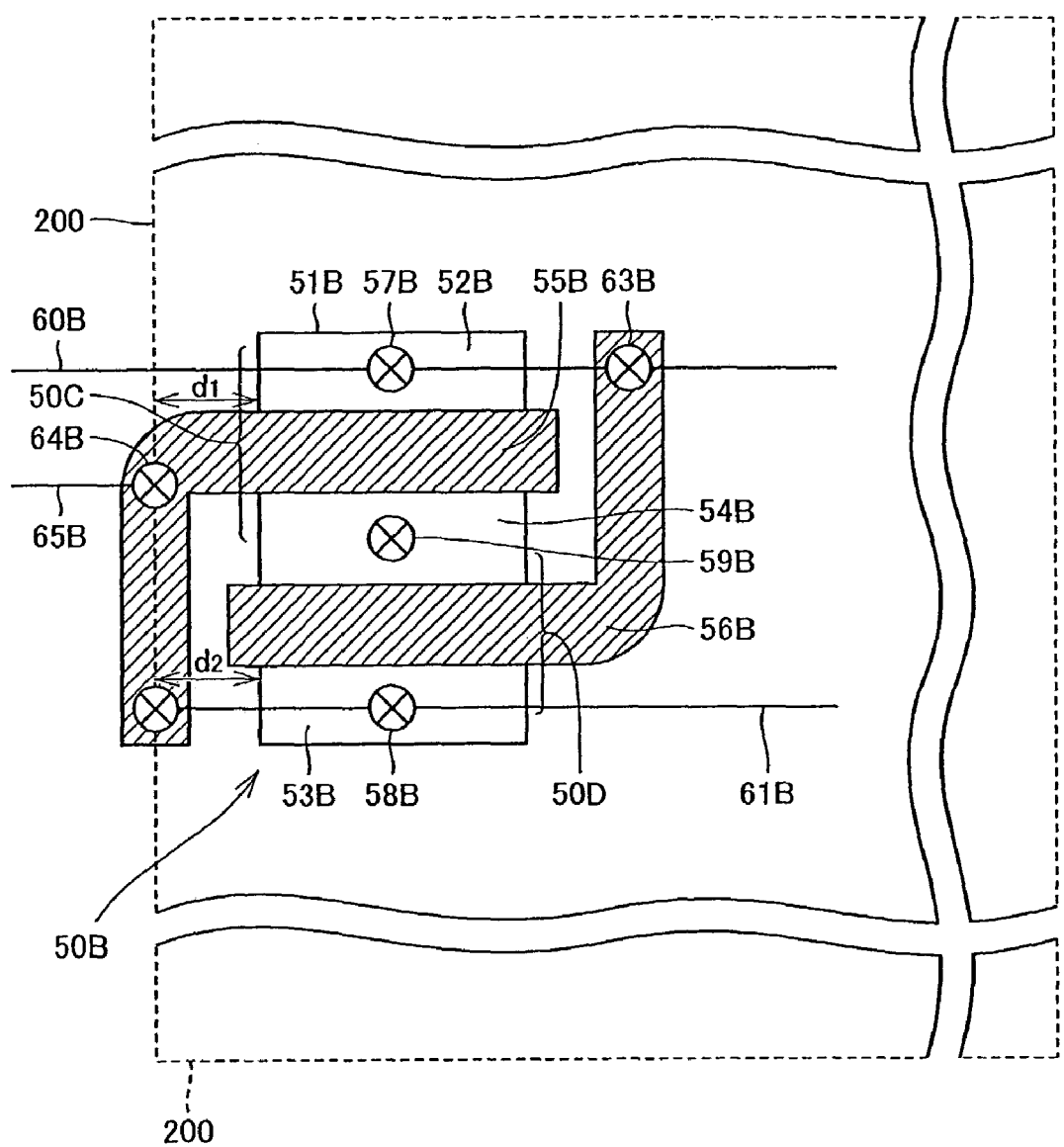
FIG. 9 is a planar schematic view showing a unit of sense amplifier having the structure shown in FIG. 8.

As shown in FIG. 9, a pair of transistors 50C and 50D is provided in a region within a well region or a channel doped region provided in the semiconductor substrate. Transistor 50C has gate electrode 55B. Transistor 50D has gate electrode 56B. Each of gate electrode 55B and gate electrode 56B extends in a direction approximately perpendicular to a boundary line 200 between the well region or the channel doped region and the other region.

Transistor 50C and transistor 50D are provided nearest boundary line 200 extending upward and downward in FIG. 9. Furthermore, transistor 50C and transistor 50D is configured such that drain region 53B, gate electrode 56B, source region 54B as a shared region, gate electrode 55B, and drain region 52B are arranged in this order in line in the direction parallel to boundary line 200. It is noted that although in the semiconductor device in the present embodiment, a source region is used as a shared region by way of example, a drain region may be used as a shared region.

According to the configuration described above, distance d1 from the aforementioned boundary line 200 to transistor 50C is approximately equal to distance d2 from the aforementioned boundary line 200 to transistor 50D, so that a difference between a threshold voltage of transistor 50C and a threshold voltage of transistor 50D resulting from the difference between distance d1 and distance d2 can be prevented.

More specifically, the semiconductor device in the present embodiment has the following structure as shown in FIG. 8.

Transistor 50C has gate electrode 55B. Transistor 50D has gate electrode 56B. Transistor 50E has gate electrode 55A. Transistor 50F has gate electrode 56A.

Assuming that a imaginary line 101 is drawn along gate electrode 55B, a imaginary line 103 is drawn along gate electrode 56B, a imaginary line 102 is drawn along gate electrode 55A, and a imaginary line 104 is drawn along gate electrode 56A, imaginary lines 101, 102, 103, and 104 are approximately parallel to each other at regular intervals.

According to the configuration described above, each of bit lines 60B, 61A, 65A, 65B can be arranged approximately parallel to the aforementioned imaginary lines 101, 102, 103, and 104 without changing the order and arrangement of the bit line pairs 60B, 65B, 65A, and 61A connected to transistors 50C, 50D, 50E, and 50F.

Therefore bit lines 60B, 65B, 65A, and 61A can be provided between transistors 50E, 50F and transistors 50C, 50D without changing any of the directions in which each of bit lines 60B, 65B, 65A, and 61A extends. As a result, the distance between transistors 50C, 50D and transistors 50E, 50F can be minimized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, in which two sense amplifiers activated are arranged adjacent each other and each of said two sense amplifiers receives a pair of data,
   said two sense amplifiers respectively including
   a first transistor receiving one of said pair of data and being of a conductive type, and
   a second transistor forming a pair with the first transistor for receiving the other of said pair of data and being of the same conductive type as that of said first transistor, wherein
   source regions of said first transistors of said two sense amplifiers are insulated from each other by an element-isolating insulating portion and connected with a first interconnection, or source regions of said second transistors of said two sense amplifiers are insulated from each other by said element-isolating insulating portion and connected with a second interconnection.

2. The semiconductor device according to claim 1, wherein said element-isolating insulating portion is formed with a silicon oxide film, and a silicon nitride film is formed on said first transistor, said second transistor, and said element-isolating insulating portion.

3. The semiconductor device according to claim 1, wherein a drain region of said first transistor in one of said two sense amplifiers, a source region of said first transistor in one of said two sense amplifiers, said element-isolating insulating portion, a source region of said first transistor in the other of said two sense amplifiers, and a drain region of said first transistor in the other of said two sense amplifiers are disposed in this order, and in a position at a prescribed distance from said first transistors in a direction orthogonal to the disposition direction, a drain region of said second transistor in one of said two sense amplifiers, a source region of said second transistor in one of said two sense amplifiers, said element-isolating insulating portion, a source region of said second transistor in the other of said two sense amplifiers, and a drain region of said second transistor in the other of said two sense amplifiers are disposed in this order so as to correspond to the disposition of portions of said first transistors.

4. The semiconductor device according to claim 3, wherein said element-isolating insulating portion is formed with a silicon oxide film, a silicon nitride film is formed on said first transistor, said second transistor, and said element-isolating insulating portion.

5. A semiconductor device, in which two sense amplifiers are arranged adjacent each other and each of said two sense amplifiers receive a pair of data, said two sense amplifiers respectively including a first transistor receiving one of said pair of data and being of a conductive type, and a second transistor forming a pair with the first transistor for receiving the other of said pair of data and being of the same conductive type as that of said first transistor, wherein in one of said two sense amplifiers, a source region of said first transistor and a source region of said second transistor are common, in the other of said two sense amplifiers, a source region of said first transistor and a source region of said second transistor are common, in one of said two sense amplifiers, a drain region of said first transistor, the common source region, and a drain region of said second transistor are disposed in this order, the other of said two sense amplifiers is provided at a prescribed distance from the common source region and drain regions of one of said two sense amplifiers in a direction orthogonal to the disposition direction, in the other of said two sense amplifiers, a drain region of said first transistor, the common source region, and a drain region of said second transistor are disposed in this order so as to correspond to the disposition of portions of one of two sense amplifiers.

6. The semiconductor device according to claim 5, wherein said first and second transistors are provided in a region within a well region or a channel doped region provided in said semiconductor substrate, and a boundary between said well region or said channel doped region and the other region extends along the disposition direction.

7. The semiconductor device according to claim 5, wherein said sense amplifiers are cross couple type sense amplifiers.

* * * * *